United States Patent
Meshii et al.

(10) Patent No.: US 9,423,304 B2
(45) Date of Patent: Aug. 23, 2016

(54) INFRARED RAY DETECTING ELEMENT AND INFRARED RAY DETECTOR INCLUDING THE SAME

(71) Applicant: Panasonic Intellectual Property Management Co., Ltd., Osaka (JP)

(72) Inventors: Ryosuke Meshii, Osaka (JP); Toshinari Noda, Osaka (JP); Hiroki Kamiguchi, Osaka (JP); Takashi Kubo, Hyogo (JP); Nobuo Sashinaka, Osaka (JP); Shoichi Taji, Kyoto (JP); Naoki Ota, Osaka (JP); Naoto Onodera, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/915,509

(22) PCT Filed: Mar. 13, 2015

(86) PCT No.: PCT/JP2015/001409
§ 371 (c)(1),
(2) Date: Feb. 29, 2016

(87) PCT Pub. No.: WO2015/146054
PCT Pub. Date: Oct. 1, 2015

(65) Prior Publication Data
US 2016/0216159 A1   Jul. 28, 2016

(30) Foreign Application Priority Data

Mar. 27, 2014 (JP) .................. 2014-065180

(51) Int. Cl.
*G01J 5/34* (2006.01)
(52) U.S. Cl.
CPC ................... *G01J 5/34* (2013.01)

(58) Field of Classification Search
CPC ............... G01J 5/024; G01J 5/34; G01J 5/20
See application file for complete search history.

(56) References Cited

U.S. PATENT DOCUMENTS

| 5,912,464 A | 6/1999 | Vilain et al. |
| 6,031,231 A * | 2/2000 | Kimata ............ G01J 5/08 250/332 |

(Continued)

FOREIGN PATENT DOCUMENTS

| JP | 05-172630 A | 7/1993 |
| JP | 10-090054 A | 4/1998 |

(Continued)

OTHER PUBLICATIONS

International Search Report and Written Opinion issued in Application No. PCT/JP2015/001409 dated Jun. 2, 2015, with partial English translation.

*Primary Examiner* — Marcus Taningco
(74) *Attorney, Agent, or Firm* — McDermott Will & Emery LLP

(57) ABSTRACT

An infrared ray detecting element includes: a substrate having a cavity; an infrared ray detecting portion including, sequentially stacked, a lower electrode layer, a detection layer, and an upper electrode layer; first and second support portions which support the infrared ray detecting portion above the cavity; and first and second external lead portions for leading electrical signals outputted from the infrared ray detecting portion, to the outside. The first support portion includes, sequentially stacked, a first upper wiring pattern, a first insulating layer, and a first lower wiring pattern. The upper electrode layer is connected to the first external lead portion via the first upper wiring pattern. The second support portion includes, sequentially stacked, a second upper wiring pattern, a second insulating layer, and a second lower wiring pattern. The lower electrode layer is connected to the second external lead portion via the second lower wiring pattern.

11 Claims, 12 Drawing Sheets

(56) References Cited

U.S. PATENT DOCUMENTS

| | | | |
|---|---|---|---|
| 6,191,420 B1* | 2/2001 | Souma | G01J 5/20 250/338.1 |
| 6,262,418 B1 | 7/2001 | Hashimoto et al. | |
| 6,348,650 B1* | 2/2002 | Endo | G01J 5/12 136/201 |
| 7,635,605 B2 | 12/2009 | Shibayama | |
| 2007/0278605 A1 | 12/2007 | Shibayama | |
| 2009/0050808 A1* | 2/2009 | Ushimi | G01J 5/02 250/338.3 |
| 2010/0155601 A1 | 6/2010 | Cho et al. | |

FOREIGN PATENT DOCUMENTS

| | | |
|---|---|---|
| JP | 11-132856 A | 5/1999 |
| JP | 2002-048636 A | 2/2002 |
| JP | 2005-241457 A | 9/2005 |
| JP | 2007-171170 A | 7/2007 |
| JP | 2013-210236 A | 10/2013 |

* cited by examiner

INFRARED RAY DETECTING ELEMENT AND INFRARED RAY DETECTOR INCLUDING THE SAME

RELATED APPLICATIONS

This application is the U.S. National Phase under 35 U.S.C. §371 of International Application No. PCT/JP2015/001409, filed on Mar. 13, 2015, which in turn claims the benefit of Japanese Application No. 2014-065180, filed on Mar. 27, 2014, the disclosures of which are incorporated by reference herein.

TECHNICAL FIELD

The present disclosure relates to an infrared ray detecting element which detects an infrared ray and an infrared ray detector including the same.

BACKGROUND ART

An infrared ray detecting element receives infrared rays which cause the infrared ray detecting element to generate heat, and thus raise the temperature of the infrared ray detecting element. The infrared ray detecting element detects a change in electrical property corresponding to the change in temperature. Infrared ray detecting elements include, for example, pyroelectric infrared ray detecting elements, resistance bolometer infrared ray detecting elements, and thermopile infrared ray detecting elements. An infrared ray detecting element, which uses pyroelectric substance material, detects infrared rays by utilizing the charge produced on its surface due to the temperature change. A resistance bolometer infrared ray detecting element, which uses a resistance bolometer material, detects infrared rays by utilizing resistance values which change due to the temperature change. A thermopile infrared ray detecting element detects infrared rays by utilizing the Seebeck effect in which thermoelectromotive force is produced by a temperature difference.

FIG. 11 is a top view schematically illustrating a conventional infrared ray detecting element 200. FIG. 12 is a cross-sectional view schematically illustrating cross-section 12-12 of the conventional infrared ray detecting element 200 in FIG. 11.

In the conventional infrared ray detecting element 200, an infrared ray detecting portion 120 has a detection layer 116 which receives infrared rays, a lower electrode layer 140, and an upper electrode layer 150. The detection layer 116 is sandwiched between the lower electrode layer 140 and the upper electrode layer 150. The infrared ray detecting portion 120 is fixed to a substrate 112 via four support portions provided in two diagonal lines. The infrared ray detecting portion 120 is disposed above a cavity 113 provided in the substrate 112.

Lead wiring patterns 170 and 171 for leading electrical signals from the infrared ray detecting portion 120 to the outside are provided on two support portions 130 and 131, respectively, which are provided in one of the diagonal lines. Lead wiring patterns 170 and 171 are connected, via external lead portions 160, to conductive vias 142 which penetrate through the substrate 112. An insulating layer 115 formed on the substrate 112, the lead wiring pattern 170 connected to the lower electrode layer 140, and an interlayer insulating film 141 are sequentially stacked in the support portion 130. Furthermore, the insulating layer 115, the interlayer insulating film 141, and the lead wiring pattern 171 connected to the upper electrode layer 150 are sequentially stacked in the support portion 131.

In this manner, the structure in which the infrared ray detecting portion 120 is separated from the substrate 112 is an insulating structure capable of preventing the heat of the infrared ray detecting portion 120 from diffusing to the substrate 112. As such, the infrared ray detecting element 200 can efficiently detect the heat in infrared ray detecting portion 120 which is generated when incident infrared rays are absorbed. With this, the infrared ray detecting element 200 is capable of enhancing infrared ray detection sensitivity.

CITATION LIST

Patent Literature

PTL 1: Japanese Unexamined Patent Application Publication Number 2007-171170

SUMMARY OF THE INVENTION

Technical Problem(s)

In the conventional infrared ray detecting element, the order in which the lead wiring pattern, the insulating layer, and the interlayer insulating film are stacked is different between the support portion 130 and the support portion 131. As such, the stress exerted on the support portion 130 and the stress exerted on the support portion 131 are different. When balance between the stress exerted on the support portion 130 and the support portion 131 is lost, there is the problem that twisting occurs in the infrared ray detecting portion. The twisting of the infrared ray detecting portion causes the infrared ray detecting portion to tilt with respect to the substrate. This causes deterioration and unevenness in the infrared ray detection sensitivity. In addition, the twisting of the infrared ray detecting portion causes damage to the support portions and disconnection of lead wiring patterns, and thus there are instances where infrared ray detection ability is lost.

The present disclosure has as an object to provide an infrared ray detecting element and an infrared ray detector which are capable of preventing twisting of the infrared ray detecting portion.

Solution to Problem

An infrared ray detecting element according to the present disclosure includes: a substrate having a cavity; an infrared ray detecting portion including a lower electrode layer, a detection layer, and an upper electrode layer which are sequentially stacked; a first support portion and a second support portion each of which supports the infrared ray detecting portion above the cavity; and a first external lead portion and a second external lead portion each for leading electrical signals outputted from the infrared ray detecting portion, to an outside of the infrared ray detecting element, wherein the first support portion includes a first lower wiring pattern, a first insulating layer, and a first upper wiring pattern which are sequentially stacked, the upper electrode layer is connected to the first external lead portion via the first upper wiring pattern, the second support portion includes a second lower wiring pattern, a second insulating layer, and a second upper wiring pattern which are sequentially stacked, and the lower electrode layer is connected to the second external lead portion via the second lower wiring pattern.

Advantageous Effect of Invention

The infrared ray detecting element and infrared ray detector according to the present disclosure are capable of preventing twisting of the infrared ray detecting portion.

DESCRIPTION OF EMBODIMENTS

Hereinafter, embodiments of the present disclosure will be described in detail with reference to the Drawings. It should be noted that each of the embodiments described below shows one specific example of the present disclosure. Therefore, the numerical values, shapes, materials, structural components, and the arrangement and connection of the structural components, etc. shown in the following embodiments are mere examples, and are not intended to limit the scope of the present disclosure. Furthermore, among the structural components in the following exemplary embodiments, components not recited in any one of the independent claims which indicate the broadest concepts of the present disclosure are described as arbitrary structural components.

Furthermore, the respective figures are schematic diagrams and are not necessarily precise illustrations. In the respective figures, substantially identical components are assigned the same reference signs, and overlapping description may be omitted or simplified.

Embodiment 1

Figure 1:
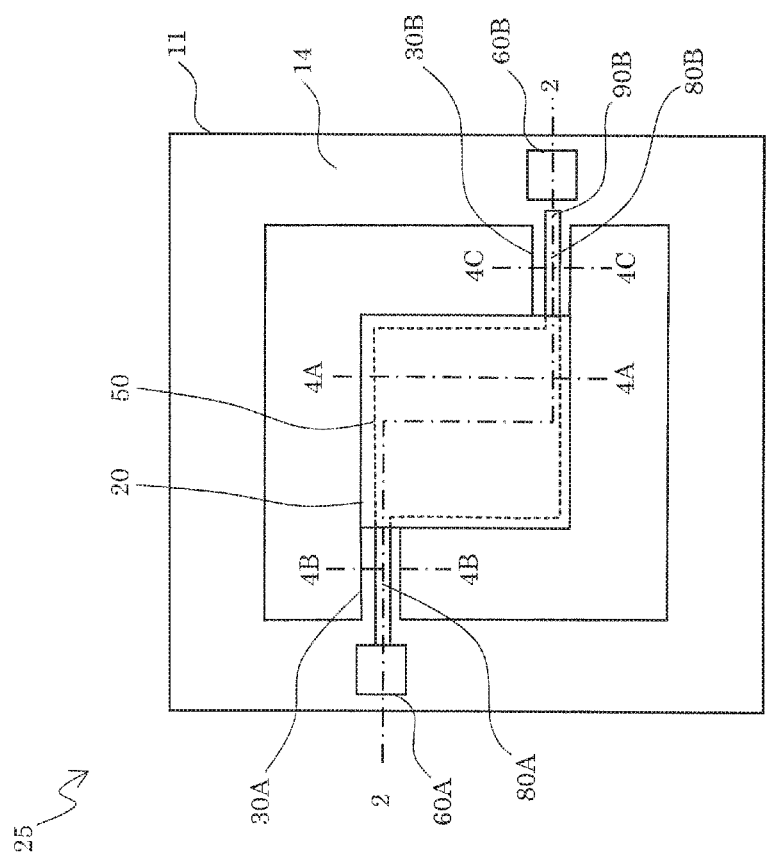
FIG. 1 is a top view schematically illustrating an infrared ray detecting element in Embodiment 1.
Figure 2:
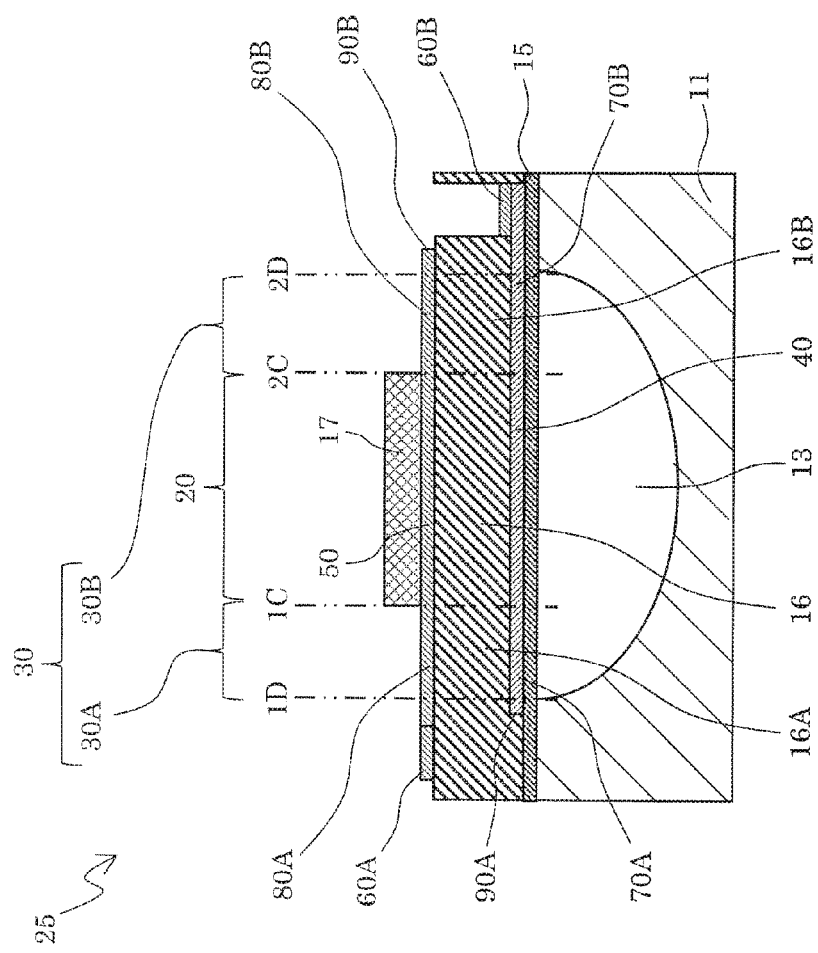
FIG. 2 is a cross-sectional view schematically illustrating cross-section 2-2 of the infrared ray detecting element in FIG. 1.
Figure 3:
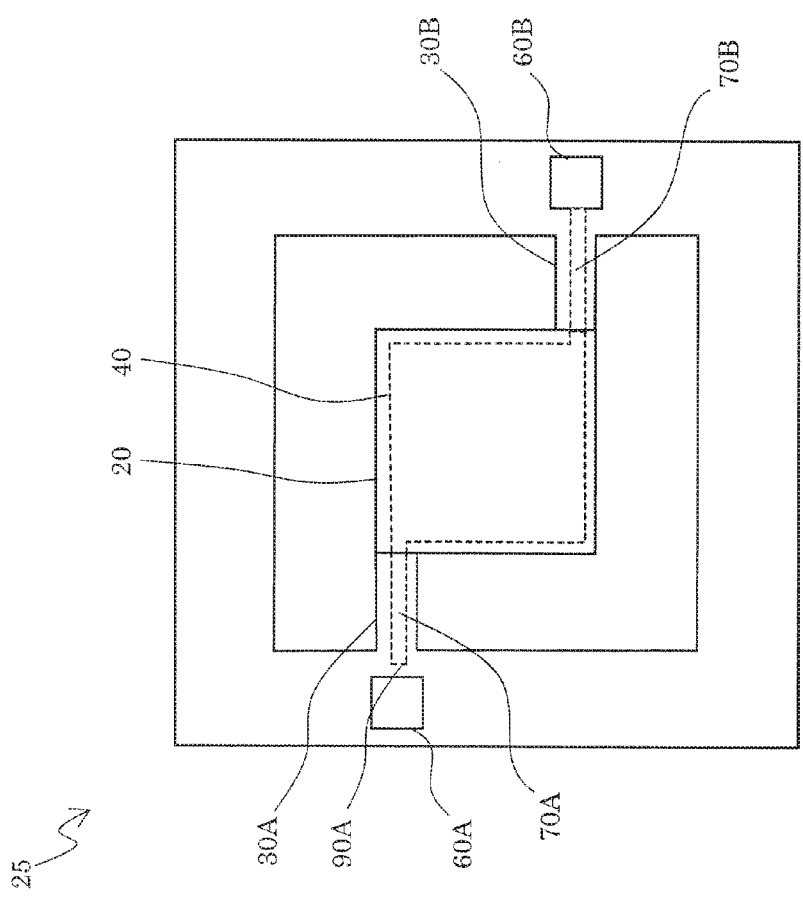
FIG. 3 is a top view schematically illustrating an arrangement of a lower wiring pattern of the infrared ray detecting element in Embodiment 1.

FIG. 1 is a top view schematically illustrating an infrared ray detecting element 25 in Embodiment 1. FIG. 2 is a cross-sectional view schematically illustrating cross-section 2-2 of the infrared ray detecting element 25 in FIG. 1. FIG. 3 is a top view schematically illustrating an arrangement of a lower wiring pattern of the infrared ray detecting element 25 in Embodiment 1.

The infrared ray detecting element 25 includes a substrate 11, an infrared ray detecting portion 20, a first support portion 30A, a second support portion 30B, a first external lead portion 60A, and a second external lead portion 60B. The substrate 11 has a cavity 13 formed in the shape of a recess. The infrared ray detecting portion 20 converts the energy of an incident infrared ray into an electrical signal, and outputs the electrical signal. The outputted electrical signal is led outside via the first external lead portion 60A and the second external lead portion 60B.

The first support portion 30A and the second support portion 30B are connected to a frame portion 14 of the substrate 11, and support the infrared ray detecting portion 20 above the cavity 13.

The cavity 13 of the substrate 11 is provided at the center of one principal face of the substrate 11. Furthermore, the substrate 11 has the frame portion 14 which defines the cavity 13. The frame portion 14 of the substrate 11 is provided in the periphery of the opening of the cavity 13.

An intermediate layer 15 having an insulating property is formed on the substrate 11. The intermediate layer 15 extends approximately parallel to the principal face of the substrate 11, and forms a portion of each of the first support portion 30A, the second support portion 30B, and the infrared ray detecting portion 20.

Figure 4A:
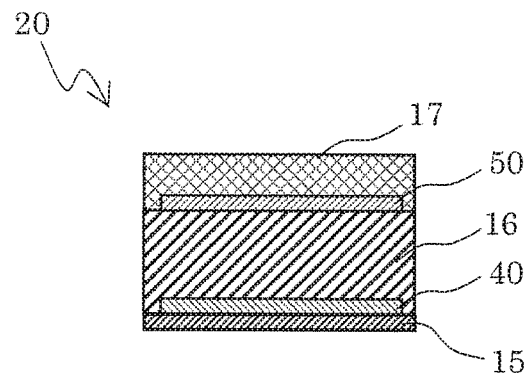
FIG. 4A is a cross-sectional view schematically illustrating cross-section 4A-4A of an infrared ray detecting portion in FIG. 1.

FIG. 4A is a cross-sectional view schematically illustrating cross-section 4A-4A of the infrared ray detecting portion 20 in FIG. 1.

As illustrated in FIG. 4A, a lower electrode layer 40, a detection layer 16, and an upper electrode layer 50 are provided in the infrared ray detecting portion 20. The intermediate layer 15 of the infrared ray detecting portion 20 is provided across the entirety of the infrared ray detecting portion 20. The infrared ray detecting portion 20 has a stacked structure in which the lower electrode layer 40, the detection layer 16, and the upper electrode layer 50 are sequentially stacked above at least a portion of the intermediate layer 15. Furthermore, an infrared ray absorbing layer 17 is provided on the top layer of the infrared ray detecting portion 20.

The infrared ray detecting element 25 detects infrared rays by utilizing a pyroelectric effect. A pyroelectric substance is used in the detection layer 16 of the infrared ray detecting portion 20. In the detection layer 16, the polarization of the surface of the pyroelectric substance changes when the temperature of the pyroelectric substance rises due to an infrared ray. As a result, a charge is generated in the lower electrode layer 40 and the upper electrode layer 50. The infrared ray detecting element 25 is able to detect the infrared ray by leading the charge to the outside as an electrical signal.

Among infrared ray detecting elements, a pyroelectric infrared ray detecting element has high signal output and low noise output, and thus has a high S/N ratio. Furthermore, a pyroelectric infrared ray detecting element allows human body sensing at low cost. As such, pyroelectric infrared ray detecting elements are widely used in automatic lighting and automatic switches for reducing power consumption of devices, etc.

It should be noted that the infrared ray detecting portion 20 can use a thermopile, a thermistor, or a bolometer, etc. instead of a pyroelectric substance.

The plan view shape of the infrared ray detecting portion 20 provided in the opening of the cavity 13 is substantially rectangular. The infrared ray detecting portion 20, however, is not limited to a rectangular shape. The infrared ray detecting portion 20 may be, for example, circular, polygonal, etc.

The infrared ray detecting portion 20 is connected to the frame portion 14 of the substrate 11 via the first support portion 30A and the second support portion 30B. In addition, the infrared ray detecting portion 20 is separated from the surface of the substrate 11 by the cavity 13. In this manner, the infrared ray detecting portion 20 is provided so as not to come into contact with the substrate 11. As such, the infrared ray detecting element 25 is capable of preventing the heat of the infrared ray detecting portion 20 from diffusing to the substrate 11, and thus has a structure in which the heat insulating property of the infrared ray detecting portion 20 with respect to the substrate 11 is high.

The first support portion 30A and the second support portion 30B are arranged at mutually point symmetric positions with respect to the center of the infrared ray detecting portion 20. It should be noted that the first support portion 30A and the second support portion 30B may be arranged at rotationally symmetric positions or line symmetric positions.

The first support portion 30A and the second support portion 30B each have a long narrow rectilinear plan view shape. The first support portion 30A and the second support portion 30B are, however, not limited to a rectilinear shape. The first support portion 30A and the second support portion 30B may have, for example, a bent shape such as an L-shape.

Furthermore, aside from the first support portion 30A and the second support portion 30B, another support portion may be further provided. The other support portion is, for example, also arranged at a mutually symmetric position with respect to the center of the infrared ray detecting portion 20. It should be noted that a lead wiring pattern is not provided in the other support portions, for example. Accordingly, the heat insulating property of the infrared ray detecting portion 20 can be enhanced.

As illustrated in FIG. 2, the portion between imaginary line 1C and imaginary line 2C is the infrared ray detecting portion 20. The portion between imaginary line 1C and imaginary line 1D is the first support section 30A. The portion between imaginary line 2C and imaginary line 2D is the second support section 30B. Here, imaginary line 1C is a line which passes along the first support portion 30A-side end face of the infrared ray absorbing layer 17. Imaginary line 2C is a line which passes along the second support portion 30B-side end face of the infrared ray absorbing layer 17. Imaginary line 1D is a line which passes along the first support portion 30A-side end face of the frame portion 14 which forms the cavity 13. Imaginary line 2D is a line which passes along the second support portion 30B-side end face of the frame portion 14 which forms the cavity 13.

The first support portion 30A includes the conductive first lower wiring pattern 70A, the first insulating layer 16A, and the conductive first upper wiring pattern 80A which are sequentially stacked. The first support portion 30A has a first opposed portion 35A in which the first lower wiring pattern 70A and the first upper wiring pattern 80A are positioned opposite each other in the stacking direction via the first insulating layer 16A. On the other hand, the second support portion 30B includes the conductive second lower wiring pattern 70B, the second insulating layer 16B, and the conductive second upper wiring pattern 80B which are sequentially stacked. The second support portion 30B has a second opposed portion 35B in which the second lower wiring pattern 70B and the second upper wiring pattern 80B are positioned opposite each other in the stacking direction via the second insulating layer 16B.

As illustrated in FIG. 2, the first upper wiring pattern 80A, the upper electrode layer 50, and the second upper wiring pattern 80B are provided in the same layer. The first insulating layer 16A, the detection layer 16, and the second insulating layer 16B are provided in the same layer. The first lower wiring pattern 70A, the lower electrode layer 40, and the second lower wiring pattern 70B are provided in the same layer.

Furthermore, the first lower wiring pattern 70A, the lower electrode layer 40, and the second lower wiring pattern 70B are made of the same material. The first upper wiring pattern 80A, the upper electrode layer 50, and the second upper wiring pattern 80B are made of the same material. The first insulating layer 16A, the detection layer 16, and the second insulating layer 16B are made of the same material. This facilitates the fabrication process.

It should be noted that the material of the first lower wiring pattern 70A and the second lower wiring pattern 70B may be different from the material of the lower electrode layer 40. In the same manner, the material of the first upper wiring pattern 80A and the second upper wiring pattern 80B may be different from the material of the upper electrode layer 50. The material of the first insulating layer 16A and the second insulating layer 16B may be different from the material of the detection layer 16. In this case, the stacked structure of the first support portion 30A and the second support portion 30B is, for example, provided to be symmetric with respect to the center of the infrared ray detecting portion 20.

Specifically, the first upper wiring pattern 80A and the second upper wiring pattern 80B are of the same material, for example. In addition, the first upper wiring pattern 80A and the second upper wiring pattern 80B are wiring patterns having the same cross-sectional area, for example. The first upper wiring pattern 80A, the upper electrode layer 50, and the second upper wiring pattern 80B are provided in the same layer, for example. Furthermore, the first lower wiring pattern 70A and the second lower wiring pattern 70B are of the same material, for example. The first lower wiring pattern 70A and the second lower wiring pattern 70B are wiring patterns having the same cross-sectional area, for example. The first lower wiring pattern 70A, the lower electrode layer 40, and the second lower wiring pattern 70B are provided in the same layer, for example. This facilitates the balancing of stress between the first support portion 30A and the second support portion 30B.

One of the first upper wiring pattern 80A and the second upper wiring pattern 80B is an upper lead wiring pattern. One of the first lower wiring pattern 70A and the second lower wiring pattern 70B is a lower lead wiring pattern. Furthermore, the other of the first upper wiring pattern 80A and the second upper wiring pattern 80B is an upper dummy wiring pattern. The other of the first lower wiring pattern 70A and the second lower wiring pattern 70B is a lower dummy wiring pattern.

One end of the upper lead wiring pattern in the extending direction of the upper lead wiring pattern is connected to the first external lead portion 60A, and the other end is connected to the upper electrode layer 50. One end of the lower lead wiring pattern in the extending direction of the lower lead wiring pattern is connected to the second external lead portion 60B, and the other end is connected to the lower electrode layer 40.

In FIG. 1 and FIG. 2, the first upper wiring pattern 80A in the first support portion 30A is the upper lead wiring pattern. In other words, the upper electrode layer 50 is connected to the first external lead portion 60A via the first upper wiring pattern 80A. Furthermore, the second lower wiring pattern 70B is the lower lead wiring pattern. In other words, the lower electrode layer 40 is connected to the second external lead portion 60B via the second lower wiring pattern 70B. The first lower wiring pattern 70A of the first support portion 30A is the lower dummy wiring pattern. The second upper wiring pattern 80B of the second support portion 30B is the upper dummy wiring pattern.

One of the ends of the first lower wiring pattern 70A which is farther from the infrared ray detecting portion 20 in the extending direction of the first lower wiring pattern 70A is provided above the frame portion 14. One of the ends of the second upper wiring pattern 80B which is farther from the infrared ray detecting portion 20 in the extending direction of the second upper wiring pattern 80B is provided above the frame portion 14.

As illustrated in FIG. 1 and FIG. 3, the first external lead portion 60A and the second external lead portion 60B are rectangular with sides that are larger than the lead wiring pattern width. The first external lead portion 60A and the second external lead portion 60B are connection terminals for leading the electrical signals from the infrared ray detecting portion 20 to the outside of the infrared ray detecting element. The first external lead portion 60A and the second external lead portion 60B are, for example, connected to a signal processing circuit which processes the electrical signals outputted from the infrared ray detecting portion 20.

The first external lead portion 60A and the second external lead portion 60B are made from the same material as one of the first upper wiring pattern 80A and the second lower wiring pattern 70B. The first external lead portion 60A is formed on the first insulating layer 16A located on the first support portion 30A side. The second external lead portion 60B is formed on the second lower wiring pattern 70B.

As illustrated in FIG. 1 and FIG. 3, the respective ends of the lower dummy wiring pattern and the upper dummy wiring pattern which are farther from the infrared ray detecting portion 20 in the extending direction of the wiring pattern are non-connected ends 90A and 90B, respectively. Specifically, the non-connected end 90A of the lower dummy wiring pattern and the non-connected end 90B of the upper dummy wiring pattern are provided so as not to be connected to the first external lead portion 60A and the second external lead portion 60B, respectively. In the infrared ray detecting element 25, the electrical signals of the infrared ray detecting portion 20 are not lead to the outside via the non-connected ends 90A and 90B.

As illustrated in FIG. 2, the non-connected end 90A of the lower dummy wiring pattern is provided between the first external lead portion 60A and the first support portion 30A so as not to overlap with the first external lead portion 60A in the stacking direction of the first support portion 30A.

Furthermore, the non-connected end 90B of the upper dummy wiring pattern is provided between the second external lead portion 60B and the second support portion 30B so as not to overlap with the second external lead portion 60B in the stacking direction of the first support portion 30A. This allows for the shortening of the dummy wiring patterns and the simplification of the wiring patterns. Furthermore, the capacitance between the lower dummy wiring pattern and the first external lead portion 60A can be reduced. Accordingly, since it is possible to reduce the impact of capacitance in the areas in the periphery of the infrared ray detecting portion 20 which receive a small amount of light, the responsiveness of the infrared ray detecting element 25 can be improved.

It should be noted that the first lower wiring pattern 70A need not have the non-connected end 90A. In this case, the first lower wiring pattern 70A functions, not as a lower dummy wiring pattern, but as a lower lead wiring pattern. The first lower wiring pattern 70A and the second lower wiring pattern 70B are each connected to the second external lead portion 60B.

In the same manner, the second upper wiring pattern 80B need not have the non-connected end 90B. In this case, the second upper wiring pattern 80B functions, not as an upper dummy wiring pattern, but as an upper lead wiring pattern. The first upper wiring pattern 80A and the second upper wiring pattern 80B are each connected to the first external lead portion 60A. It should be noted that plural first external lead portions 60A and plural second external lead portions 60B may be provided. In this case, each of the first upper wiring pattern 80A and the second upper wiring pattern 80B can be connected to a different first external lead portion. Furthermore, in the same manner, each of the lower lead wiring patterns can also be connected to a different second external lead portion.

Figure 4B:
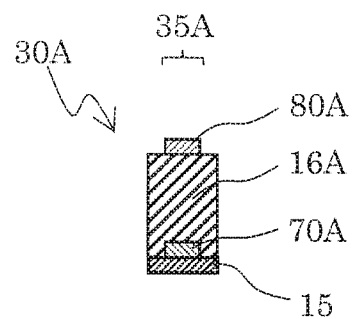
FIG. 4B is a cross-sectional view schematically illustrating cross-section 4B-4B of a first support portion in FIG. 1.
Figure 4C:
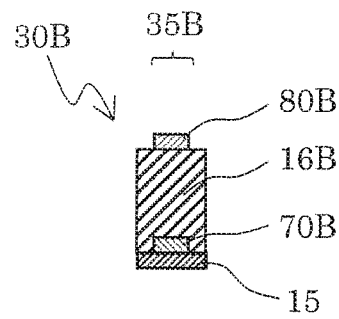
FIG. 4C is a cross-sectional view schematically illustrating cross-section 4C-4C of a second support portion in FIG. 1.

FIG. 4B is a cross-sectional view schematically illustrating cross-section 4B-4B of the first support portion 30A in FIG. 1. FIG. 4C is a cross-sectional view schematically illustrating cross-section 4C-4C of a second support portion 30B in FIG. 1. Cross-section 4B-4B is a plane perpendicular to the extending direction of the first support portion 30A. Cross-section 4C-4C is a plane perpendicular to the extending direction of the second support portion 30B.

As illustrated in FIG. 4B, in the first support portion 30A, the first lower wiring pattern 70A, the first insulating layer 16A, and the first upper wiring pattern 80A are sequentially stacked above the intermediate layer 15. The first lower wiring pattern 70A is the lower dummy wiring pattern. The first upper wiring pattern 80A is the upper lead wiring pattern. As illustrated in FIG. 4C, in the second support portion 30B, the second lower wiring pattern 70B, the second insulating layer 16B, and the second upper wiring pattern 80B are sequentially stacked above the intermediate layer 15. The second lower wiring pattern 70B is the lower lead wiring pattern. The second upper wiring pattern 80B is the upper dummy wiring pattern.

As illustrated in FIG. 1 to FIG. 3, the first opposed portion extends across the entirety of the extending direction of the first support portion 30A. As illustrated in FIG. 4B, the first opposed portion 35A extends in a portion of the cross-section of the first support portion 30A. Furthermore, the second opposed portion is provided across the entirety of the extending direction of the second support portion 30B. As illustrated in FIG. 4C, the second opposed portion 35B is provided in a portion of the cross-section of the second support portion 30B. In this manner, the first support portion 30A and the second support portion 30B have the same stacked structure. With this, it possible to balance the stress exerted on each of the first support portion 30A and the second support portion 30B.

The non-connected end 90A, which is one end of the lower dummy wiring pattern, and the non-connected end 90B, which is one end of the upper dummy wiring pattern, are provided above the frame portion 14 of the substrate 11. Furthermore, the other end of the lower dummy wiring pattern is connected to the lower electrode layer 40. The other end of the upper dummy wiring pattern is connected to the upper electrode layer 50.

A relatively large amount of stress tends to be exerted on the base portions of support portion 30. At this time, by providing the non-connected end 90A and the non-connected end 90B above the frame portion 14 of the substrate 11, the upper wiring pattern and the lower wiring pattern are provided at the base portions of the support portion 30. With this, the base portions of the support portion 30 can be reinforced, and damage can be inhibited.

The infrared ray absorbing layer 17 provided on the top layer of the infrared ray detecting portion 20 absorbs infrared rays. By providing the infrared ray absorbing layer 17, infrared ray detection sensitivity can be improved. As illustrated in FIG. 4A, the infrared ray absorbing layer 17 covers the entirety of the top portion of the infrared ray detecting portion 20. $SiO_2$ or a metallic black film, etc. can be used as a component material of the infrared ray absorbing layer 17. The metallic black film is a material referred to as a platinum black film or a gold black film. It should be noted that the infrared ray absorbing layer 17 or a protective film may be provided in the top layer of the support portion.

Next, the component materials of the infrared ray detecting element 25 will be described.

For the material of the pyroelectric substance of the detection layer 16, it is possible to use a perovskite oxide ferroelectric substance having lead zirconate titanate (PZT) as a principal component. Perovskite oxide ferroelectric substances include, for example, a substance having PZT as a principal component but with part of the PZT elements replaced with an element such as La, Ca, Sr, Nb, Mg, Mn, Zn or Al.

The composition of PZT may be close to the composition of a tetragonal system; Zr/Ti=30/70, for example, However, it is sufficient that the composition of PZT is: Zr/Ti=0/100 to 70/30. For example, the composition of PZT may be a composition (Zr/Ti=53/47) that is close to the phase boundary (morphotropic phase boundary) of a tetragonal system and a rhombohedral system, or $PbTiO_3$.

PZT is oriented to the (001) plane of the tetragonal system, for example. This enables enhancement of infrared ray detection sensitivity.

PMN (Chemical formula: Pb $(Mg_{1/3}Nb_{2/3})O_3$) or PZN (chemical formula: Pb $(Zn_{1/3}Nb_{2/3})$ $O_3$) can be used as another component material of the pyroelectric substance.

As a component material of the substrate 11, it is possible to use, for example, a semiconductor material such as Si, a metal material such as stainless steel, or a metal oxide such as MgO.

The substrate 11 has, for example, a larger linear thermal expansion coefficient than the detection layer 16. Accordingly, in the film-forming process of the detection layer 16, compressive stress caused by thermal contraction can be exerted on the film to be formed. Since this compressive stress causes the detection layer 16 to be selectively oriented in the (001) direction, which is the polarization axis direction, a high pyroelectric coefficient γ (gamma) can be obtained.

Specifically, stainless steel having iron or chromium as a principal component is used as the material of the substrate 11. An example of such stainless steel is SUS430. The linear thermal expansion coefficient of SUS430 is 10.5 ppm/K. On the other hand, the linear thermal expansion coefficient of PZT is 7.9 ppm/K. Therefore, the linear thermal expansion coefficient of the substrate 11 is larger than the linear thermal expansion coefficient of the detection layer 16.

Aside from stainless steel, materials for the substrate 11 which have a larger linear thermal expansion coefficient than the detection layer 16 include, for example, metal materials, polycrystalline materials, glass materials, or ceramics-based materials. Metal materials include Ti, Al, Mg, etc. Polycrystalline materials include MgO, $CaF_2$, etc. Glass materials include borosilicate glass, etc. Ceramics-based materials include $TiO_2$, $ZrO_2$, etc.

An insulating material having a silicon oxide, such as $SiO_2$, as a principal component is used in the intermediate layer 15. Furthermore, a silicon nitride such as SiN or silicon oxynitride (SiON), or $HfO_2$, etc., may be used as the intermediate layer 15.

The lower electrode 40 uses, for example, a material having lanthanum nickel oxide ($LaNiO_3$, hereafter denoted as "LNO") as a principal component.

LNO having a perovskite structure is an oxide having metallic electrical conductivity. Resistivity at room temperature is approximately $1 \times 10^{-3}$ (Ω·cm).

Materials having LNO as a principal component also include a material obtained by replacing part of nickel with an other metal, etc. The other metal includes at least one type of metal selected from a group composed of iron, aluminum, manganese, and cobalt.

It should be noted that the lower electrode 40 that is made of an LNO-based material is formed using a vapor-phase growth method such as sputtering or various commonly-known film-forming methods such as hydrothermal synthesis.

A metal such as Au, Ti, Al, Pt, and Cr or an alloy including at least one of these metals can be used as the material of the upper electrode layer 50. The upper electrode layer 50 is configured of a single layer of these metals. Alternatively, the upper electrode layer 50 may be configured of a layered body obtained by stacking plural layers including these metals. The upper electrode layer 50 can be configured of a layered body obtained by sequentially stacking Ti and Au, for example. The thickness of the upper electrode layer 50 is preferably in the range of 5 to 500 nm.

Next, a method of fabricating the infrared ray detecting element 25 in Embodiment 1 will be described.

First, a layered film is formed above the substrate 11 in which a cavity is not yet formed. The layered film is obtained by sequentially stacking the intermediate layer 15, a lower electrode film, a detection film, an upper electrode film, and the infrared ray absorbing layer 17 above the substrate 11.

As for the method of fabricating the layered film, a silicon oxide precursor solution is applied on the substrate 11 to form a silicon oxide precursor film. Then, the silicon oxide precursor film is refined by heating to form the silicon oxide intermediate layer 15. Next, an LNO precursor solution is applied on the intermediate layer 15 to form an LNO precursor film. Subsequently, the LNO precursor film is crystallized by rapid heating to form the lower electrode film.

Next, masks corresponding to the lower electrode layer 40, the first lower wiring pattern 70A, and the second lower wiring pattern 70B are formed on the lower electrode film using photolithography, etc. Then, the masks are removed after patterning is performed on the lower electrode film using dry etching or wet etching. With this, the lower electrode layer 40, the first lower wiring pattern 70A, and the second lower wiring pattern 70B are formed. In other words, the lower electrode layer 40, the first lower wiring pattern 70A, and the second lower wiring pattern 70B have the same thickness, are configured of the same material, and are formed in the same layer.

In addition, a PZT precursor solution is applied on the principal face of the substrate 11, including the lower electrode layer 40, the first lower wiring pattern 70A, and the second lower wiring pattern 70B, to form a PZT precursor film. Then, the PZT precursor film is crystallized by heating the PZT precursor film to form a PZT film. Here, the detection film of the layered film is the PZT film. Patterning is performed on the PZT film to form the detection layer 16, the first insulating layer 16A, and the second insulating layer 16B. In other words, the detection layer 16, the first insulating layer 16A, and the second insulating layer 16B have the same thickness, are configured of the same material, and are formed on the same layer.

Next, the upper electrode film is formed on the detection layer 16, the first insulating layer 16A, and the second insulating layer 16B, using a dry process such as ion sputtering. Patterning is performed on the upper electrode film to form the upper electrode layer 50, the first upper wiring pattern 80A, the second upper wiring pattern 80B, the first external lead portion 60A, and the second external lead portion 60B. In other words, the upper electrode layer 50, the first upper wiring pattern 80A, the second upper wiring pattern 80B, the first external lead portion 60A, and the second external lead portion 60B have the same thickness, are configured of the same material, and are formed in the same layer.

Next, the infrared ray absorbing layer 17 is formed on the detecting layer by plasma CVD. Thus, the layered film is formed in the above manner.

After the layered film is formed, the first external lead portion and the second external lead portion are exposed using an etching method such as wet etching and dry etching. Subsequently, after exposing a portion of the substrate which will become an opening, wet etching is further performed until the bottom face of the intermediate layer 15 is separated from the top face of the substrate 11. With this, the cavity 13 is formed on the principal face of the substrate 11. Thus, the infrared ray detecting element 25 is fabricated in the above manner.

Embodiment 2

In the infrared ray detecting element in Embodiment 2, disconnection portions are provided in the infrared ray detecting portion or the support portion. In the infrared ray detecting element in Embodiment 2, the same reference signs are used for components which are identical to those in the infrared ray detecting element in Embodiment 1, and their detailed description is omitted.

An upper disconnection portion is provided in at least one of the infrared ray detecting portion and the support portion in which the upper dummy wiring pattern is provided. Here, the upper dummy wiring pattern is provided in either the first support portion or the second support portion. The upper disconnection portion electrically insulates between the upper electrode layer and one end of the upper dummy wiring pattern. In the same manner, a lower disconnection portion is provided in at least one of the infrared ray detecting portion and the support portion in which the lower dummy wiring pattern is provided. Here, the lower dummy wiring pattern is provided in either the first support portion or the second support portion. The lower disconnection portion electrically insulates between the lower electrode layer and one end of the lower dummy wiring pattern.

Figure 5:
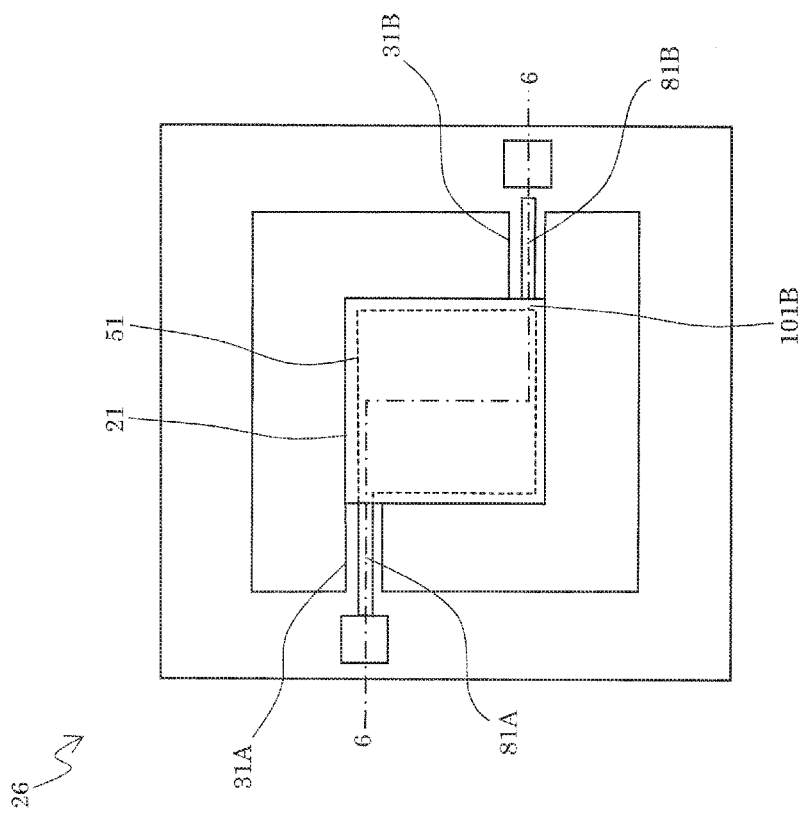
FIG. 5 is a top view schematically illustrating an infrared ray detecting element in Embodiment 2.
Figure 6:
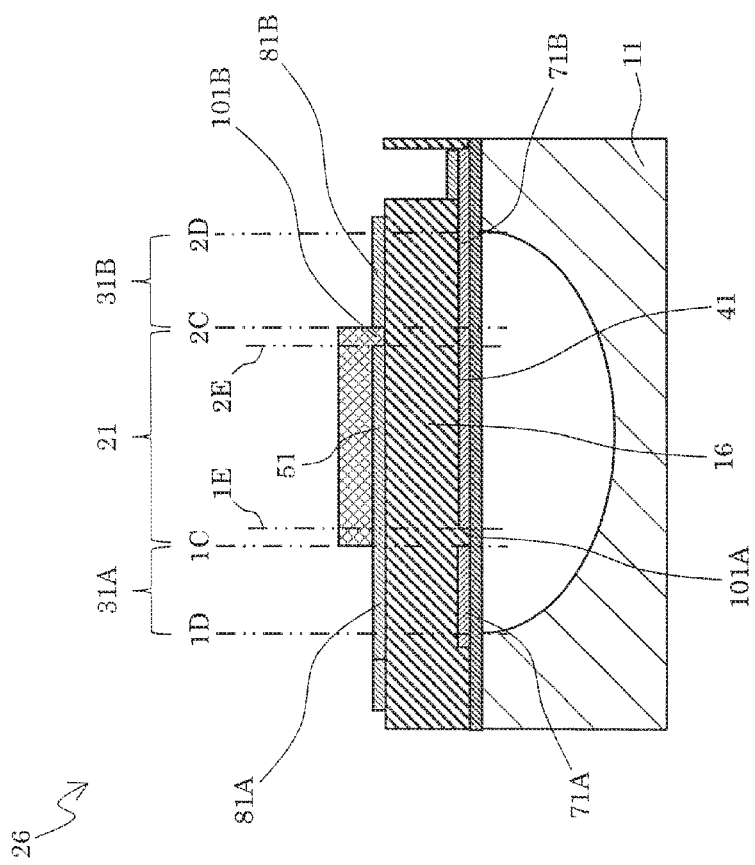
FIG. 6 is a cross-sectional view schematically illustrating cross-section 6-6 of the infrared ray detecting element in FIG. 5.

FIG. 5 is a top view schematically illustrating an infrared ray detecting element 26 in Embodiment 2. FIG. 6 is a cross-sectional view schematically illustrating cross-section 6-6 of the infrared ray detecting element 26 in FIG. 5.

As illustrated in FIG. 5 and FIG. 6, in the infrared ray detecting element 26, a first upper wiring pattern 81A disposed in a first support portion 31A is an upper lead wiring pattern. A first lower wiring pattern 71A is a lower dummy wiring pattern. A second upper wiring pattern 81B disposed in a second support portion 31B is an upper dummy wiring pattern. A second lower wiring pattern 71B is a lower lead wiring pattern.

The infrared ray detecting element 26 includes an upper disconnection portion 101B which electrically insulates between an upper electrode layer 51 and the end of the second upper wiring pattern 81B which is farther from an infrared ray detecting portion 21 in the extending direction.

Furthermore, the infrared ray detecting element 26 includes a lower disconnection portion 101A which electrically insulates between a lower electrode layer 41 and the end of the first lower wiring pattern 71A which is farther from the infrared ray detecting portion 21 in the extending direction.

The upper disconnection portion 101B is provided in a portion of the infrared ray detecting portion 21 which is adjacent to the second support portion 31B. The upper disconnection portion 101B causes the upper electrode layer 51 and the end of the upper dummy wiring pattern to be disposed with a space (the space between imaginary line 2C and imaginary line 2E) therebetween. Here, imaginary line 2E is a line passing along the second support portion 31B-side end face of the upper electrode layer 51.

Furthermore, the lower disconnection portion 101A is provided in a portion of the infrared ray detecting portion 21 which is adjacent to the first support portion 31A. The lower disconnection portion 101A causes the lower electrode layer 41 and the end of the lower dummy wiring pattern to be disposed with a space (the space between imaginary line 1C and imaginary line 1E) therebetween. Here, imaginary line 1E is a line passing along the first support portion 31A-side end face of the lower electrode layer 41.

The other end of the upper dummy wiring pattern and the other end of the lower dummy wiring pattern are provided above the infrared ray detecting portion 21-side bases of the second support portion 31B and the first support portion 31A, respectively.

The one end of the upper dummy wiring pattern and the one end of the lower dummy wiring pattern are provided above the frame portion 14. It should be noted that the one end of the upper dummy wiring pattern and the one end of the lower dummy wiring pattern need not be provided above the frame portion 14.

By providing at least one of the upper disconnection portion 101B and the lower disconnection portion 101A, it is possible to prevent the heat generated in the infrared ray detecting portion 21 from diffusing to the substrate via the conductive dummy wiring patterns. Accordingly, the infrared ray detection sensitivity of the infrared ray detecting element 26 can be improved.

Furthermore, because of the upper disconnection portion 101B and the lower disconnection portion 101A, the capacitance created between a dummy wiring pattern and the wiring pattern opposite the dummy wiring pattern in the stacking direction has no impact on the capacitance of the infrared ray detecting portion 21. As such, the impact of capacitance can be reduced in the areas in the periphery of the infrared ray detecting portion 21 which receive a small amount of light. Therefore, the infrared ray detection sensitivity of the infrared ray detecting element 26 can be enhanced.

In the upper disconnection portion 101B, the space between the upper electrode layer 51 and the second upper wiring pattern 81B (the upper dummy wiring pattern) is preferably in the range of 2 μm to 10 μm. In the lower disconnection portion 101A, the space between the lower electrode layer 41 and the first lower wiring pattern 71A (the lower dummy wiring pattern) is preferably in the range of 2 μm to 10 μm.

Figure 7:
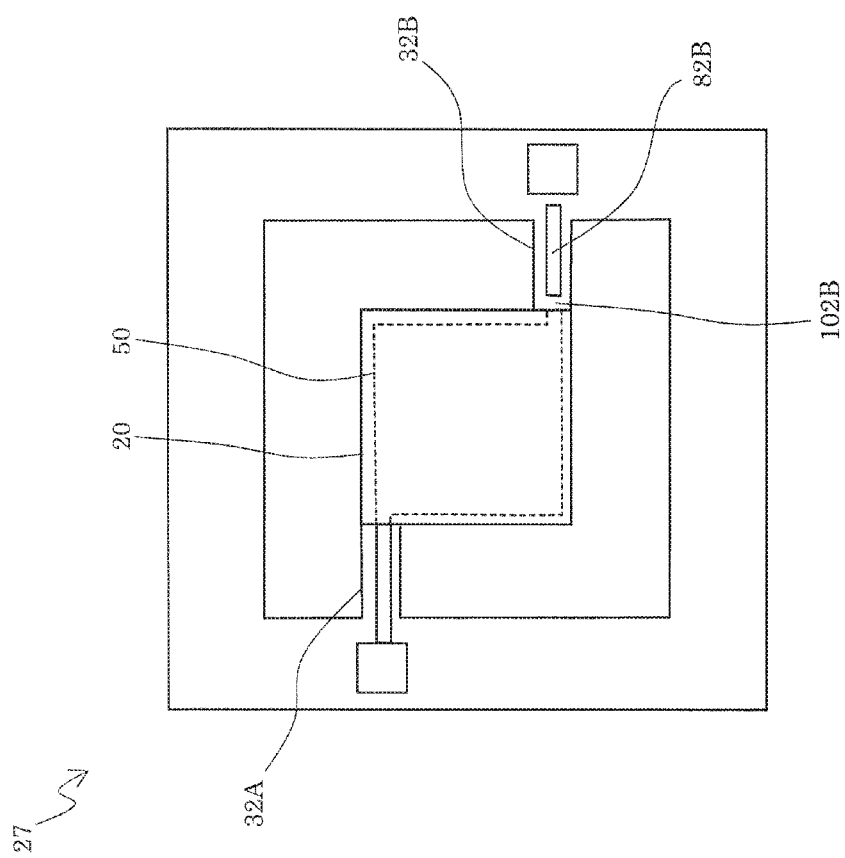
FIG. 7 is a top view schematically illustrating another infrared ray detecting element in Embodiment 2.

FIG. 7 is a top view schematically illustrating another infrared ray detecting element 27.

In a second support portion 32B, an upper disconnection portion 102B is provided in the other end of a second upper wiring pattern 82B which is on the infrared ray detecting portion 20 side. The second upper wiring pattern 82B is an upper dummy wiring pattern. In the same manner, in a first support portion 32A, a lower disconnection portion (not illustrated) is provided on the other end of a first lower wiring pattern which is on the infrared ray detecting portion 20 side. The first support portion 32A is a lower dummy wiring pattern. In this manner, the upper dummy wiring pattern and the lower dummy wiring pattern are divided by the upper disconnection portion 102B and the lower disconnection portion, respectively.

Furthermore, the upper disconnection portion 102B may be provided at a middle portion of the second upper wiring pattern 82B. In the same manner, the lower disconnection portion may be provided at a middle portion of the first lower wiring pattern.

Figure 8:
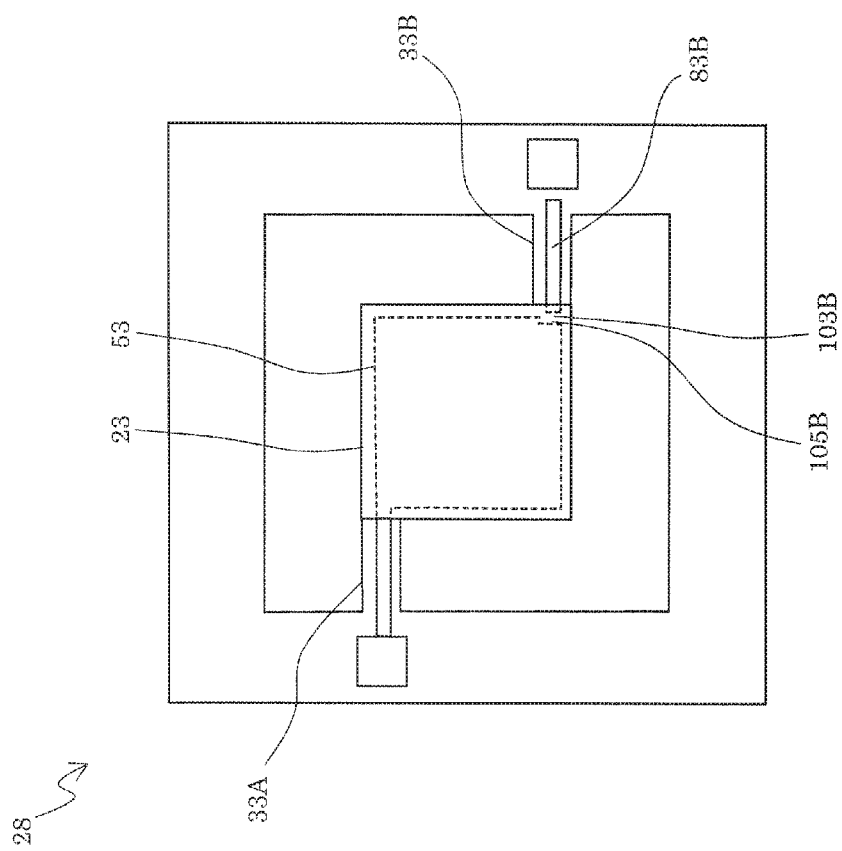
FIG. 8 is a top view schematically illustrating another infrared ray detecting element in Embodiment 2.

FIG. 8 is a top view schematically illustrating yet another infrared ray detecting element 28.

An upper disconnection portion 103B is provided in an infrared ray detecting portion 23. In addition, an upper dummy wiring pattern extends up to the infrared ray detecting portion 23. Specifically, the other end of the upper dummy wiring pattern is provided in the infrared ray detecting portion 23.

An upper cut-out portion 105B, which is rectangular in shape and obtained by cutting-out a portion of an upper electrode layer 53, is provided on a second support portion 33B-side of the infrared ray detecting portion 23. A second upper wiring pattern 83B extends up to the infrared ray detecting portion 23. The second upper wiring pattern 83B is an upper dummy wiring pattern. Specifically, the upper dummy wiring pattern is provided from the second support portion 33B up to a portion of the upper cut-out portion 105B of the infrared ray detecting portion 23. A lower lead wiring pattern, pyroelectric substance, and the upper dummy wiring pattern are sequentially stacked in the portion of the upper cut-out portion 105B.

In the same manner as the upper disconnection portion 103B, a lower disconnection portion (not illustrated) is provided in the infrared ray detecting portion 23. In addition, a lower dummy wiring pattern extends up to the infrared ray detecting portion 23. Specifically, an end of the lower dummy wiring pattern is provided in the infrared ray detecting portion 23. A lower cut-out portion (not illustrated) is provided in a lower electrode layer, on a first support portion 33A-side of the infrared ray detecting portion 23. The lower dummy wiring pattern which is the first lower wiring pattern is provided from the first support portion 33A up to a portion of the lower cut-out portion of the infrared ray detecting portion 23. The lower dummy wiring pattern, pyroelectric substance, and an upper lead wiring pattern are sequentially stacked in the portion of the lower cut-out portion.

In this manner, the second upper wiring pattern 83B and the lower wiring pattern are provided in the stacking direction, in the connecting portion between the second support portion 33B and the infrared ray detecting portion 23. As such, the base of the second support portion 33B is reinforced by the wiring pattern layer, and thus damage to the base can be prevented. Furthermore, by providing the upper disconnection portion 103B in the infrared ray detecting portion 23, it possible to prevent heat diffusion from the infrared ray detecting portion 23 to the substrate 11. The same advantageous effect as in the second support portion 33B is also produced for the first support portion 33A.

It should be noted that, in the case where an upper dummy wiring pattern and a lower dummy wiring pattern are provided in the infrared ray detecting portion, an upper cut-out portion and a lower cut-out portion need not be provided.

Embodiment 3

In the infrared ray detecting element 25 in Embodiment 1, the upper lead wiring pattern and the lower lead wiring pattern are provided in the first support portion 30A and the second support portion 30B, respectively. In contrast, in an infrared ray detecting element in Embodiment 3, an upper lead wiring pattern and a lower lead wiring pattern are provided in the same support portion, that is, one of a first support portion and a second support portion.

Figure 9:
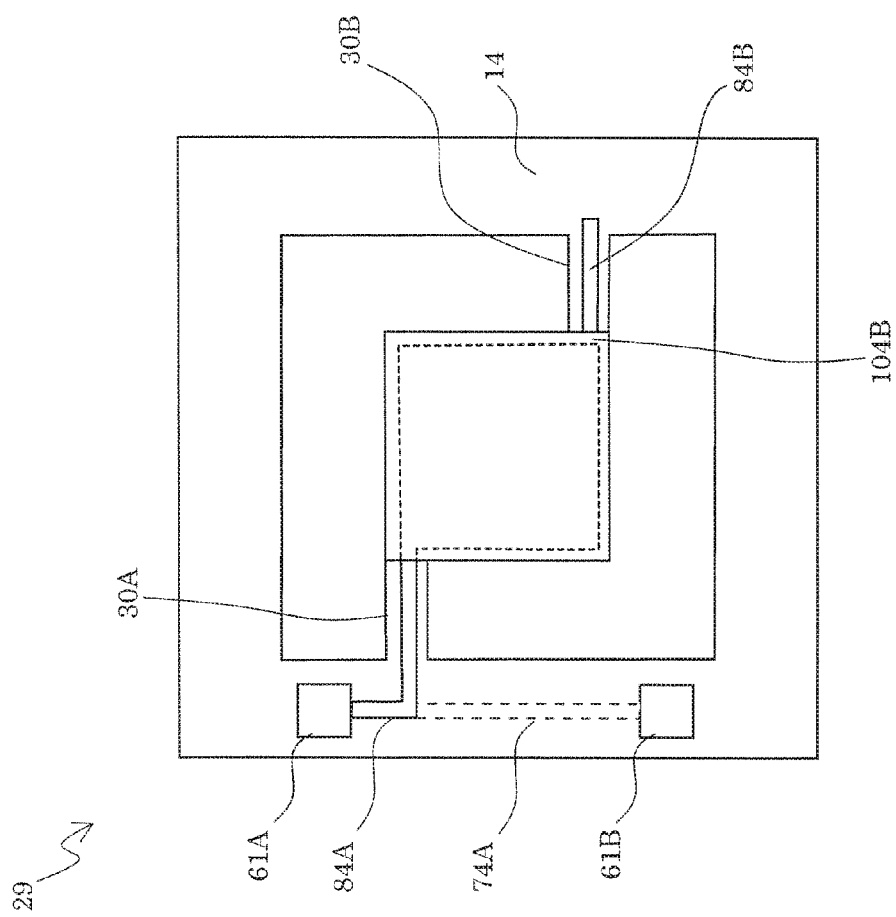
FIG. 9 is a top view schematically illustrating an infrared ray detecting element in Embodiment 3.

FIG. 9 is a top view schematically illustrating an infrared ray detecting element 29 in Embodiment 3.

A first external lead portion 61A and a second external lead portion 61B are provided on the first support portion 30A-side of the frame portion 14. A first upper wiring pattern 84A and a first lower wiring pattern 74A are provided in the first support portion 30A. The first upper wiring pattern 84A is connected to the first external lead portion 61A. The first lower wiring pattern 74A is connected to the second external lead portion 61B. In other words, in the first support portion 30A, the first upper wiring pattern 84A is the upper lead wiring pattern. The first lower wiring pattern 74A is the lower lead wiring pattern.

A second upper wiring pattern 84B and a second lower wiring pattern (not illustrated) are provided in the second support portion 30B. The second upper wiring pattern 84B is an upper dummy wiring pattern. The second lower wiring pattern is a lower dummy wiring pattern. In the same manner as in Embodiment 2, an upper disconnection portion 104B and a lower disconnection portion (not illustrated) are, for example, provided to the upper dummy wiring pattern and the lower dummy wiring pattern, respectively, as illustrated in FIG. 9. In this case, the upper disconnection portion 104B and the lower disconnection portion overlap in the stacking direction. It should be noted that the upper disconnection portion 104B and the lower disconnection portion may be staggered when seen from the top. Staggering the upper disconnection portion 104B and the lower disconnection portion allows for the strengthening of the second support portion 30B.

Embodiment 4

Figure 10:
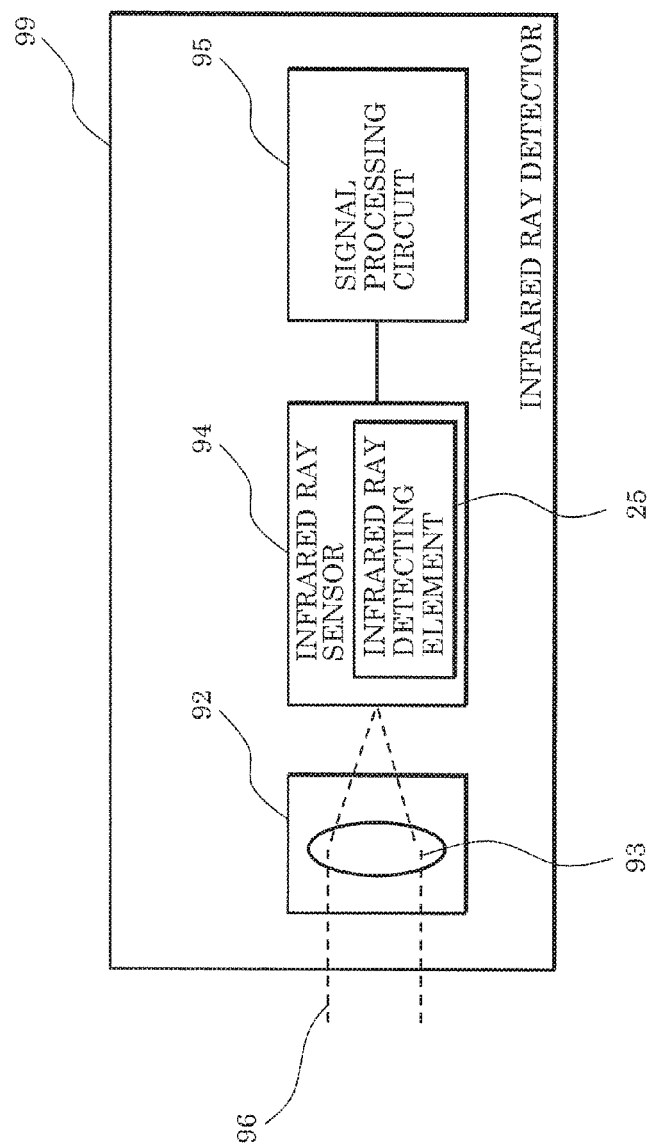
FIG. 10 is a block diagram illustrating a configuration of an infrared ray detector in Embodiment 4.
Figure 11:
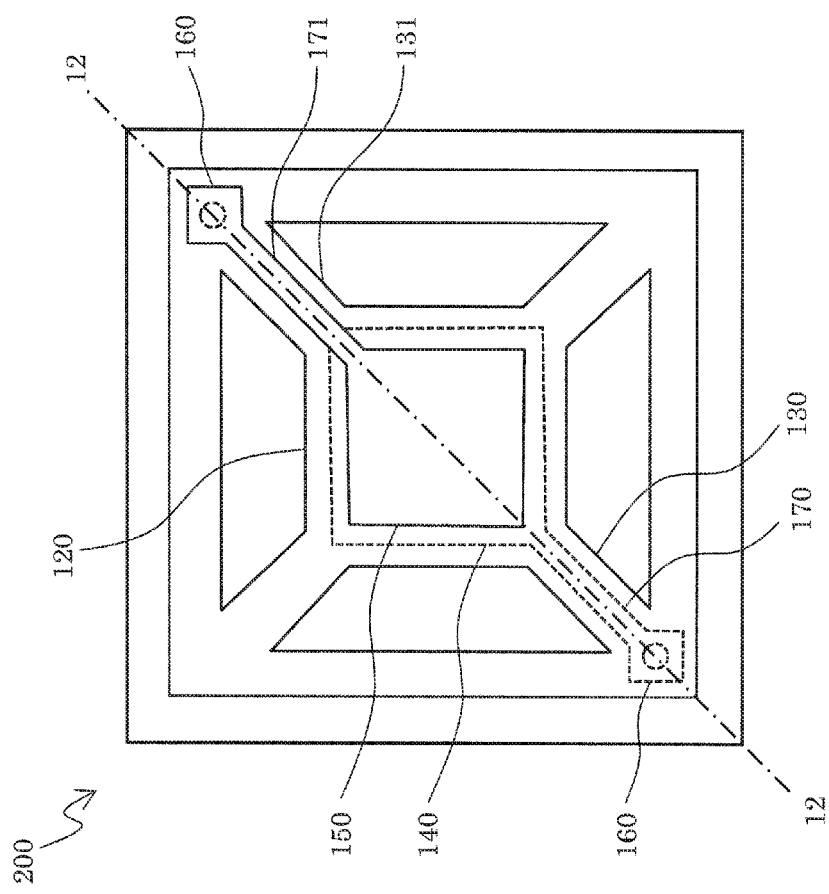
FIG. 11 is a top view schematically illustrating a conventional infrared ray detecting element.
Figure 12:
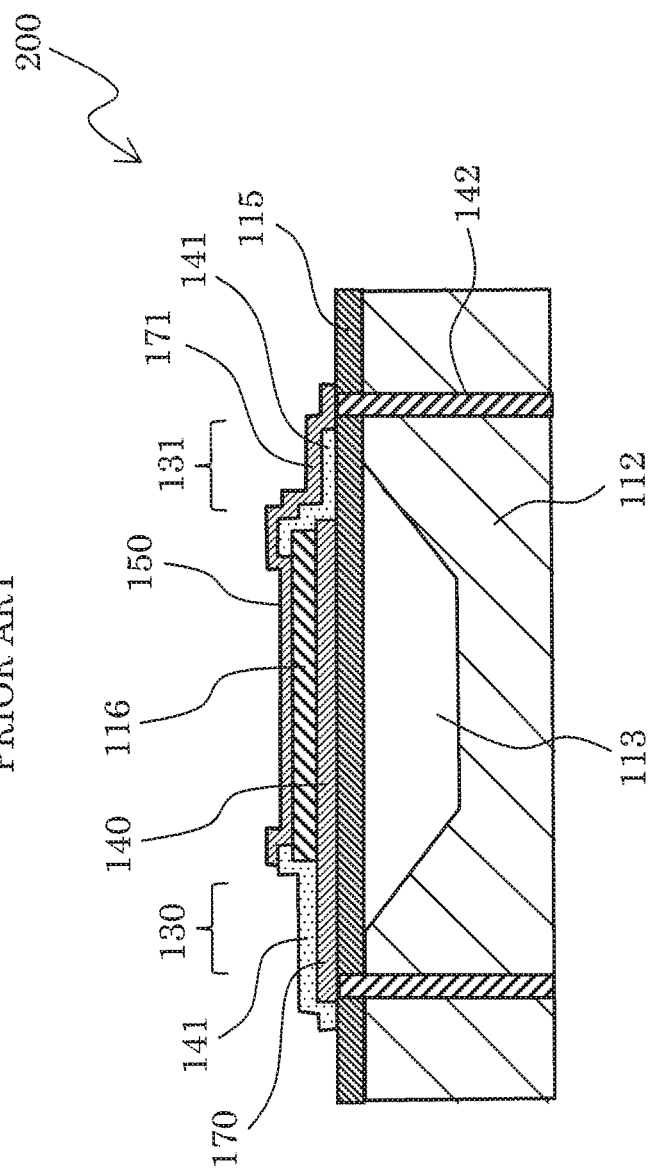
FIG. 12 is a cross-sectional view schematically illustrating cross-section 12-12 of the conventional infrared ray detecting element in FIG. 11.

FIG. 10 is a block diagram illustrating a configuration of an infrared ray detector 99. The infrared ray detector 99 is an example of an infrared ray detector including the infrared ray detecting element 25.

An optical system block 92 includes an optical component 93 such as a lens which collects incident infrared rays or a filter which selectively transmits infrared rays. An incident infrared ray 96 is received by an infrared ray sensor 94 via the optical system block 92. The infrared ray 96 is reflected light of an infrared ray beam emitted toward a subject such as a human body, an infrared ray beam that is blocked by a subject's movement, etc., or an infrared ray emitted from a person, etc.

The infrared ray sensor 94 includes the infrared ray detecting element 25. There may be a single unit or plural units of the infrared ray detecting element 25. Plural infrared ray detecting elements are, for example, arranged in a two-dimensional matrix. Furthermore, plural infrared ray detecting elements may be arranged in a single line. When using plural infrared ray detecting elements, an array of lenses corresponding to the respective infrared ray elements may be used as the optical component 93.

A signal processing circuit 95 includes an amplifier circuit which amplifies output signals of the infrared ray detecting element, an analog-to-digital converting circuit, etc. The output signals of the infrared ray detecting element are inputted to the signal processing circuit 95. The signal processing circuit 95 processes the output signals of the infrared ray detecting element to thereby output an object detection signal, an object-movement signal or object-action signal, an image signal, a temperature signal, etc.

When incident light is modulated by a chopper, etc., the infrared ray detector 99 may use a control circuit which controls the chopper, and a tuned amplifier circuit. Furthermore, the infrared ray detector 99 may include a lamp indicating the detection of an object, a monitor for displaying an image signal, etc., a recording medium such as a memory for recording a temperature signal, etc., and so on.

Although infrared ray detecting elements and an infrared ray detector according to one or more aspects have been described based on the embodiments thus far, the present disclosure is not limited to the foregoing embodiments. Forms obtained by various modifications to the exemplary embodiments that can be conceived by a person of skill in the art as well as forms realized by combining structural components in different exemplary embodiments, which are within the scope of the essence of the present disclosure may be included in one or more aspects.

INDUSTRIAL APPLICABILITY

An infrared ray detecting element in the present disclosure is suitable for use in electronic devices such as a human detection sensors, infrared cameras, thermography devices, night vision devices, etc.

The invention claimed is:

1. An infrared ray detecting element comprising:
   a substrate having a cavity;
   an infrared ray detecting portion including a lower electrode layer, a detection layer, and an upper electrode layer which are sequentially stacked;
   a first support portion and a second support portion each of which supports the infrared ray detecting portion above the cavity; and
   a first external lead portion and a second external lead portion each for leading electrical signals outputted from the infrared ray detecting portion, to an outside of the infrared ray detecting element,
   wherein the first support portion includes a first lower wiring pattern, a first insulating layer, and a first upper wiring pattern which are sequentially stacked,
   the upper electrode layer is connected to the first external lead portion via the first upper wiring pattern,
   the second support portion includes a second lower wiring pattern, a second insulating layer, and a second upper wiring pattern which are sequentially stacked, and
   the lower electrode layer is connected to the second external lead portion via the second lower wiring pattern.

2. The infrared ray detecting element according to claim 1,
   wherein the substrate has a frame portion which forms the cavity,
   one of ends of the first lower wiring pattern which is farther from the infrared ray detecting portion in an extending direction of the first lower wiring pattern is provided above the frame portion, and
   one of ends of the second upper wiring pattern which is farther from the infrared ray detecting portion in an extending direction of the second upper wiring pattern is provided above the frame portion.

3. The infrared ray detecting element according to claim 1, further comprising:
   an upper disconnection portion which electrically insulates between the upper electrode layer and one of ends of the second upper wiring pattern which is farther from the infrared ray detecting portion in an extending direction of the second upper wiring pattern.

4. The infrared ray detecting element according to claim 3,
   wherein the upper disconnection portion is provided at an other of the ends of the second upper wiring pattern.

5. The infrared ray detecting element according to claim 3,
   wherein the upper disconnection portion is provided in the infrared ray detecting portion.

6. The infrared ray detecting element according to claim 1, further comprising:
   a lower disconnection portion which electrically insulates between the lower electrode layer and one of ends of the first lower wiring pattern which is farther from the infrared ray detecting portion in an extending direction of the first lower wiring pattern.

7. The infrared ray detecting element according to claim 6,
   wherein the lower disconnection portion is provided at an other of the ends of the first lower wiring pattern.

8. The infrared ray detecting element according to claim 6,
   wherein the lower disconnection portion is provided in the infrared ray detecting portion.

9. The infrared ray detecting element according to claim 1,
   wherein the first upper wiring pattern, the upper electrode layer, and the second upper wiring pattern are provided in a same layer,
   the first insulating layer, the detection layer, and the second insulating layer are provided in a same layer, and the first lower wiring pattern, the lower electrode layer, and the second lower wiring pattern are provided in a same layer.

10. The infrared ray detecting element according to claim 1, wherein the first upper wiring pattern, the upper electrode layer, and the second upper wiring pattern comprise a same material, the first insulating layer, the detection layer, and the second insulating layer comprise a same material, and the first lower wiring pattern, the lower electrode layer, and the second lower wiring pattern comprise a same material.

11. An infrared ray detector comprising the infrared ray detecting element according to claim 1.

* * * * *